(12) United States Patent
Wischnewskij et al.

(10) Patent No.: US 8,482,185 B2
(45) Date of Patent: Jul. 9, 2013

(54) ULTRASONIC ACTUATOR

(75) Inventors: Alexej Wischnewskij, Wörth (DE);
Wladimir Wischnewskiy, Waldbronn (DE); Ulrich Brüggemann, Pforzheim (DE); Reinhard Hübner, Niedercunnersdorf (DE); Siegfried Lindig, Gera (DE)

(73) Assignee: Physik Instrumente (PI) GmbH & Co. KG, Karlsruhe (DE)

( * ) Notice: Subject to any disclaimer, the term of this patent is extended or adjusted under 35 U.S.C. 154(b) by 327 days.

(21) Appl. No.: 12/736,917

(22) PCT Filed: May 27, 2009

(86) PCT No.: PCT/EP2009/056436
§ 371 (c)(1),
(2), (4) Date: Feb. 22, 2011

(87) PCT Pub. No.: WO2009/147037
PCT Pub. Date: Dec. 10, 2009

(65) Prior Publication Data
US 2011/0175489 A1 Jul. 21, 2011

(30) Foreign Application Priority Data
Jun. 2, 2008 (DE) .......... 10 2008 026 429

(51) Int. Cl.
*H01L 41/09* (2006.01)
*H02N 2/00* (2006.01)

(52) U.S. Cl.
USPC .............. 310/323.01; 310/328; 310/367

(58) Field of Classification Search
USPC ............ 310/323.01–323.19, 328, 367
See application file for complete search history.

(56) References Cited

U.S. PATENT DOCUMENTS

| | | | |
|---|---|---|---|
| 5,665,918 A | 9/1997 | Takano et al. | 73/662 |
| 5,672,903 A | 9/1997 | Butler et al. | 257/467 |
| 6,121,717 A | 9/2000 | Diefenbach et al. | 310/323.02 |
| 6,765,335 B2 | 7/2004 | Wischnewskiy | 310/323.02 |

FOREIGN PATENT DOCUMENTS

EP 0924778 6/1999

OTHER PUBLICATIONS

International Search Report (In English) dated Aug. 31, 2009.

(Continued)

*Primary Examiner* — Thomas Dougherty
(74) *Attorney, Agent, or Firm* — Gerald T. Bodner

(57) ABSTRACT

The invention relates to an ultrasonic actuator, preferably for use in an ultrasonic motor, in the form of a piezoelectric plate with a length L, height H and thickness t, wherein the piezoelectric plate has a lateral plane of symmetry Sq, a longitudinal plane of symmetry Sl and at least two main surfaces, and the piezoelectric plate comprises at least two generators symmetrically disposed with respect to plane of symmetry Sq for generating ultrasonic standing waves. According to the invention, the piezoelectric plate has a shape that includes at least eight lateral surfaces, wherein at least two of the lateral surfaces are working surfaces for contacting of elements to be driven, and at least two of the lateral surfaces are holding surfaces for holding the piezoelectric plate, and the remaining lateral surfaces are free surfaces, wherein at least four free surfaces are arranged at an identical angle α with respect to the longitudinal plane of symmetry Sl and/or at an identical angle φ with respect to the lateral plane of symmetry Sq.

20 Claims, 17 Drawing Sheets

OTHER PUBLICATIONS

Aoyagi, et al., "*Ultrasonic Motor based on coupled longitudinal-bending vibrations of a diagonally symmetric piezoelectric ceramic plate*", Electronics & Communications in Japan, Part II—Electronics, Wiley Periodicals, Inc.; Jun. 1, 1996; vol. 79, No. 6; pp. 60-67, Figure 3(b); Hoboken, New Jersey; XP000637373.

Yaralioglu, et al., "*Finite element modeling of capacitive micromachined ultrasonic transducers*", Proceedings of SPIE—The International Society for Optical Engineering; vol. 5750, No. 1; pp. 77-86, Figure 1; 2005, Bellingham, WA; XP002541790.

Jiann-Gang, et al., "*Fourier series method for plane elastic problems of polygonal domain*", Computer Methods in Applied Mechanics and Engineering; vol. 190, No. 35-36; pp. 4569-4585; Jun. 8, 2001, Elsevier Science B.V.; XP002541791.

International Preliminary Report on Patentability (Chapter I of the Patent Cooperation Treaty) (with Written Opinion), in English, dated Dec. 6, 2010.

ULTRASONIC ACTUATOR

The invention relates to an ultrasonic actuator, preferably for use in an ultrasonic motor, in the form of a piezoelectric plate with a length L, a height H and a thickness t, wherein the piezoelectric plate has a lateral plane of symmetry Sq, a longitudinal plane of symmetry Sl and at least two main surfaces, and the piezoelectric plate comprises at least two generators arranged symmetrically with respect to the plane of symmetry Sq for generating ultrasonic standing waves, according to the preamble of patent claim 1.

Ultrasonic actuators of this type and ultrasonic motors comprising them may be used in miniaturized inexpensive devices with a low energy consumption, such as miniature cameras, mobile phone objectives, miniature storage devices and similar equipment, which require small dimensions, a high positioning accuracy and a low energy consumption for the drive.

Documents U.S. Pat. Nos. 5,672,903 and 5,665,918 describe ultrasonic actuators for ultrasonic motors, which are designed as complex, assembled vibrators and which consist of a resonator onto which piezoelectric excitation plates are glued. The disadvantage of these actuators is that their constructional design is relatively complicated and their production laborious. Therefore, they are ineligible as an inexpensive mass product for the use in miniaturized devices.

Moreover, an ultrasonic actuator for an ultrasonic motor is known from Document U.S. Pat. No. 6,765,335 whose resonator is designed as a piezoelectric plate with a rectangular shape (FIG. 2). This ultrasonic actuator is characterized by a simple construction and an easily controllable production technology. Therefore, it appears to be suited as an inexpensive mass product. However, this ultrasonic actuator has the drawback that the operation thereof requires a relatively high electric power, which results in an increased energy consumption. Therefore, such an ultrasonic actuator is ineligible for the use in miniature devices having a correspondingly required low energy consumption.

Therefore, it is the object of the invention to provide an ultrasonic actuator which is of a simple constructional design, on the one hand, and is characterized by an easily controllable production technology and, on the other hand, by a low electric energy consumption along with increased operational stability and safety.

According to the invention this object is achieved with an ultrasonic actuator of the aforementioned type, whereof the piezoelectric plate has a shape that includes at least eight lateral faces, wherein at least two of the lateral faces are working surfaces provided to contact elements to be driven, and at least two of the lateral faces are holding surfaces provided to hold the piezoelectric plate, and the remaining lateral faces are free surfaces, wherein at least four free surfaces are arranged at a same angle $\alpha$ with respect to the longitudinal plane of symmetry Sl and/or at a same angle $\phi$ with respect to the lateral plane of symmetry Sq. The contacting of the elements to be driven by the working surfaces may be direct or indirect. Also, the piezoelectric plate may be held by the holding surfaces directly or indirectly.

It may be advantageous that the working surfaces have a width n and the holding surfaces have a width m, and that the ratio plate length L to n and/or the ratio plate height H to m is in the range between 1.1 and 9, and is preferably approximately equal to 5. This brings about a particularly favorable operating behavior of the ultrasonic actuator.

Moreover, it may be advantageous that the ratio L to H is in the range between 1.5 and 3, and is preferably approximately equal to 2. This embodiment, too, brings about a favorable operating behavior of the ultrasonic actuator.

In addition, it may be advantageous that the ratio L to the plate thickness t is in the range between 5 and 15, and is preferably approximately equal to 10. This embodiment likewise has a positive effect on the operating behavior of the ultrasonic actuator.

It may be favorable that the free surfaces have at least section-wise a concave and/or convex shape. This extends the constructive possibilities of the ultrasonic actuator.

Also, it may be favorable that each of the generators comprises an excitation electrode and a general electrode, which are arranged on the main surfaces of the piezoelectric plate, and that a piezoelectric ceramics is arranged between the excitation electrode and the general electrode. This simplifies the construction of the ultrasonic actuator.

Furthermore, it may be advantageous that each of the generators comprises several layers of excitation electrodes, general electrodes and layers of piezoelectric ceramics each arranged there between, wherein said layers are arranged in parallel to the main surfaces of the piezoelectric plate. This reduces the necessary excitation voltage of the ultrasonic actuator.

Moreover, it may be favorable that at least one of the working surfaces comprises at least one friction element or at least one slide. This extends the constructive realization possibilities for realizing the ultrasonic actuator.

It may be an advantage that at least one of the working surfaces comprises at least section-wise a guide groove. This, too, extends the constructive realization possibilities for realizing the ultrasonic actuator.

Also, it may be an advantage that the friction element and/or the slide and/or the guide groove has/have at least section-wise an abrasion-resistant layer on the surface. This increases the lifetime of the ultrasonic actuator.

In addition, it may be an advantage that at least one of the holding surfaces comprises at least one fixing element or at least section-wise a fixing groove. This increases the positioning accuracy.

It will be appreciated that also combinations of the above-described advantageous embodiments are possible.

The invention will be explained in more detail below by means of embodiments, with the aid of figures.

Figure 1:
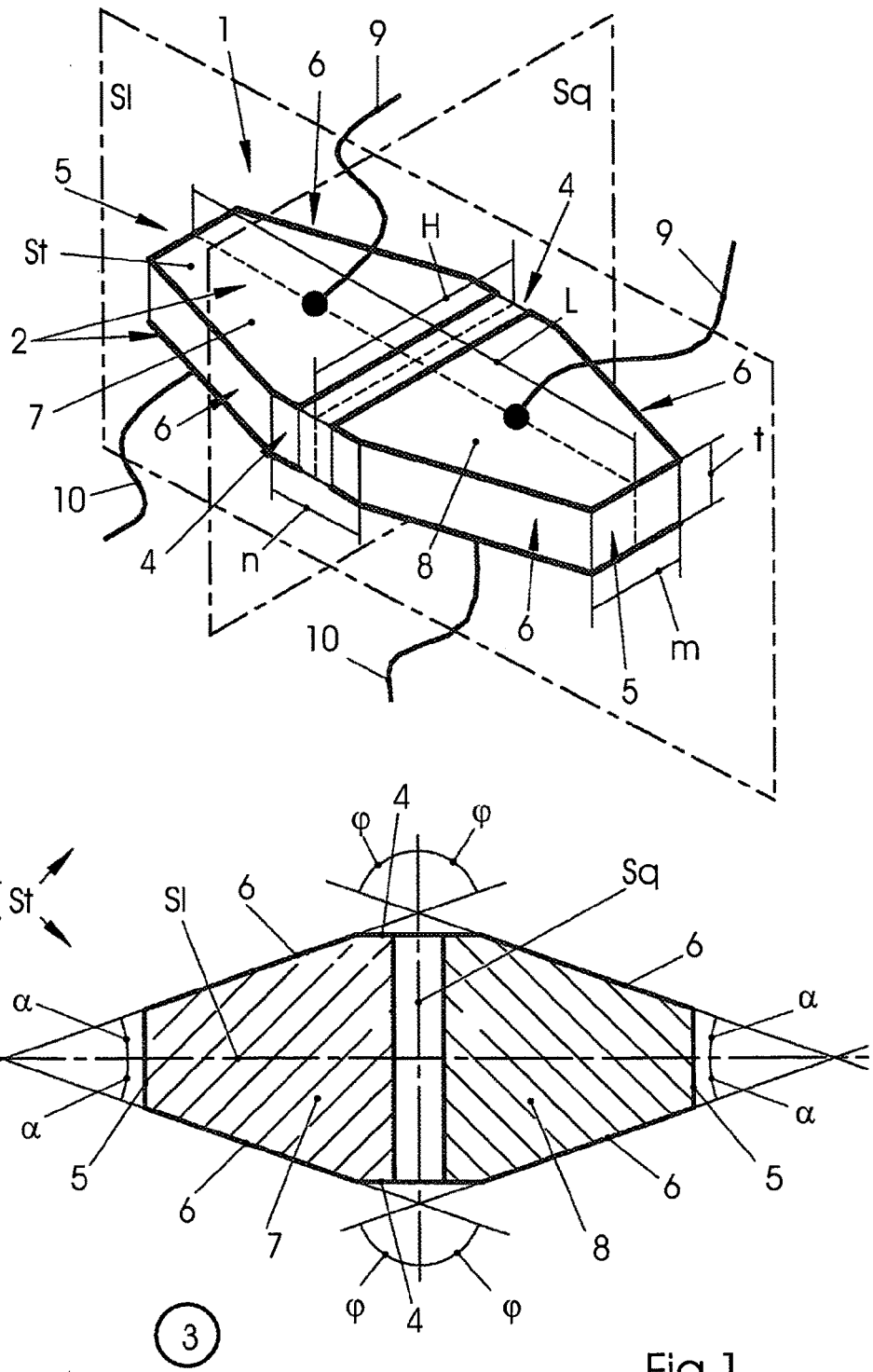
FIG. 1 shows a schematic representation of a first embodiment of the inventive ultrasonic actuator in a perspective view (top) and top view (bottom, illustration 3)

FIG. 12-18 show a schematic representation of different examples of use of the inventive ultrasonic actuator FIG. 1 shows a first embodiment of the ultrasonic actuator according to the invention. It is comprised of a piezoelectric plate 1 having a longitudinal plane of symmetry Sl and a lateral plane of symmetry Sq arranged perpendicular with respect thereto. The piezoelectric plate 1 comprises two opposite main surfaces 2 which are substantially parallel with respect to each other and which are arranged perpendicular with respect to the planes of symmetry Sl and Sq. The opposite main surfaces 2 are connected to each other by eight lateral faces, wherein two lateral faces are working surfaces 4, two lateral faces are holding surfaces 5 and the remaining four lateral faces are free surfaces 6. With respect to plane St, which is arranged both perpendicular with respect to the plane of symmetry Sl and perpendicular with respect to the plane of symmetry Sq and which may coincide with one of the main surfaces 2 or be located there between, the cross-sectional area of the piezoelectric plate has an octagonal shape (see also illustration 3 of FIG. 1).

The working surfaces 4 are substantially parallel with respect to the plane of symmetry Sl, the holding surfaces 5 are substantially parallel with respect to the plane of symmetry Sq, and the free surfaces 6 are arranged at the same angle α with respect to the plane of symmetry Sl and at the same angle φ with respect to the plane of symmetry Sq.

The piezoelectric plate 1 has the height H, which corresponds to the distance of the two working surfaces 4, and the length L, which corresponds to the distance of the two holding surfaces 5. The width of the working surfaces 4 is equal to n, and the width of the holding surfaces 5 is equal to m. Moreover, the piezoelectric plate 1 has the thickness t. The ratio of length L to height H of the inventive ultrasonic actuator is in the range of 1.5 to 3. It is optimal if the ratio L/H is approximately equal to 2.

The piezoelectric plate 1 comprises two generators 7 and 8 for generating ultrasonic standing waves, which are arranged symmetrically with respect to the plane of symmetry Sq. Each of the generators 7 and 8 is in symmetry relative to the plane of symmetry Sl and in asymmetry relative to the plane of symmetry Sq. For connecting an electrical excitation device the generators 7 and 8 comprise connections 9 and 10.

Figure 2:
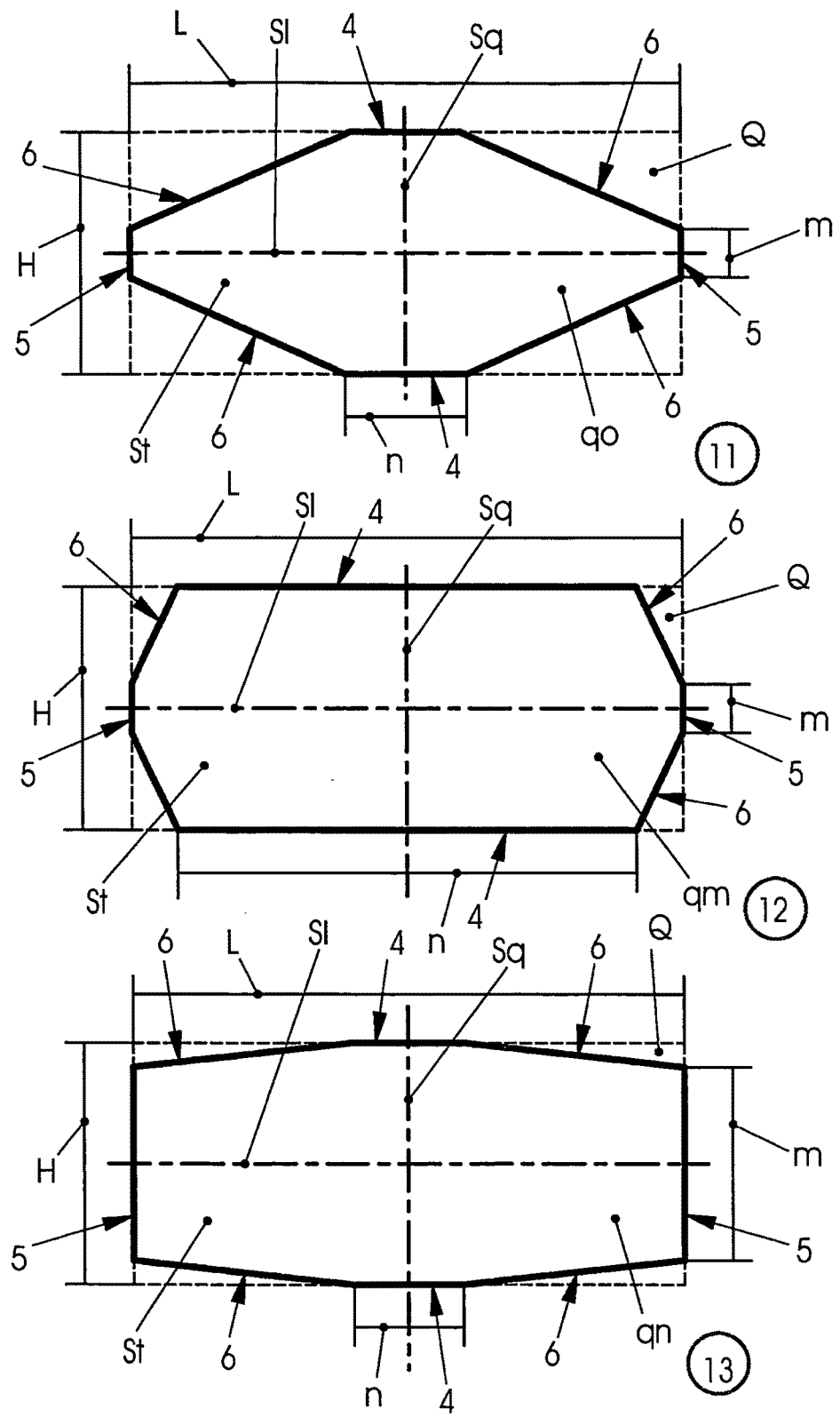
FIG. 2, 3 show a schematic representation of different other embodiments of the inventive ultrasonic actuator.

FIG. 2 shows different embodiments of the ultrasonic actuator according to the invention with different width n of the working surfaces 4 and/or different width m of the holding surfaces 5. The ratio of length L to width n of the working surface 4 and the ratio of height H to width m of the holding surface 5 may be within the range of 1.1 to 9. It is optimal if the ratio L/n or H/m is approximately equal to 5. The thickness t is approximately equal to 0.1 L.

Representations 11, 12 and 13 of FIG. 2 exemplarily show three cases for the realization of the piezoelectric plate 1. In the first case (representation 11) L/n=H/m=5, in the second case (representation 12) L/n=1.2 and H/m=5, in the third case (representation 13) L/n=5 and H/m=1.2. The cross-sectional area of the piezoelectric plate 1 relative to plane St is qo in the first case, qm in the second case and qn in the third case.

In representations 11, 12 and 13 of FIG. 2 the rectangular shape of the piezoelectric plate known from the prior art according to Document U.S. Pat. No. 6,765,335 is represented by dashed lines, which allows a direct comparison of the corresponding cross-sectional area Q relative to plane St with the cross-sectional areas qo, qn and qm.

Figure 3:
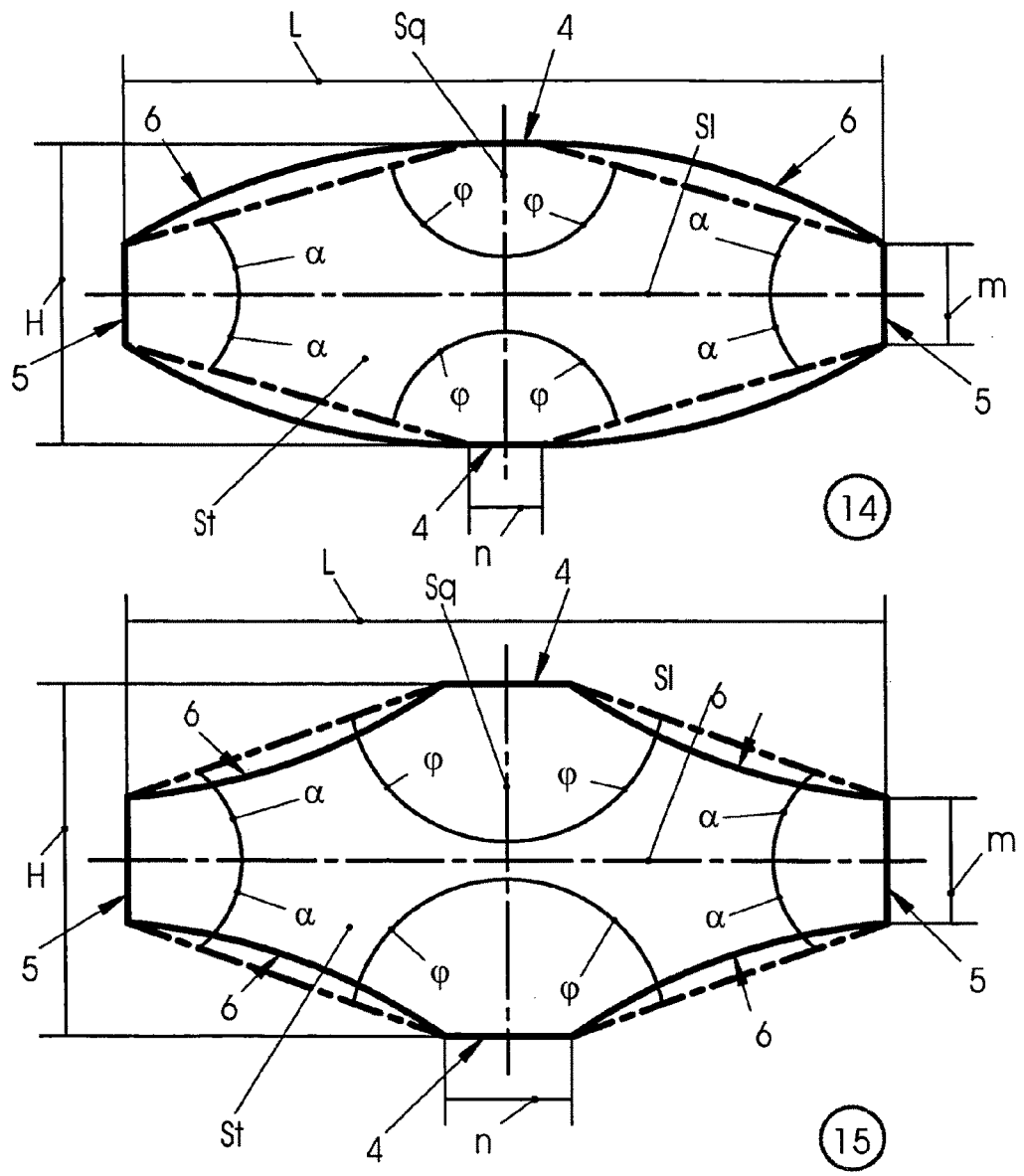

FIG. 3 shows in representations 14 and 14 additional embodiments of the ultrasonic actuator according to the invention, whose piezoelectric plate 1 includes free surfaces 6 which have a convex shape (illustration 14) and a concave shape (illustration 15).

Figure 4:
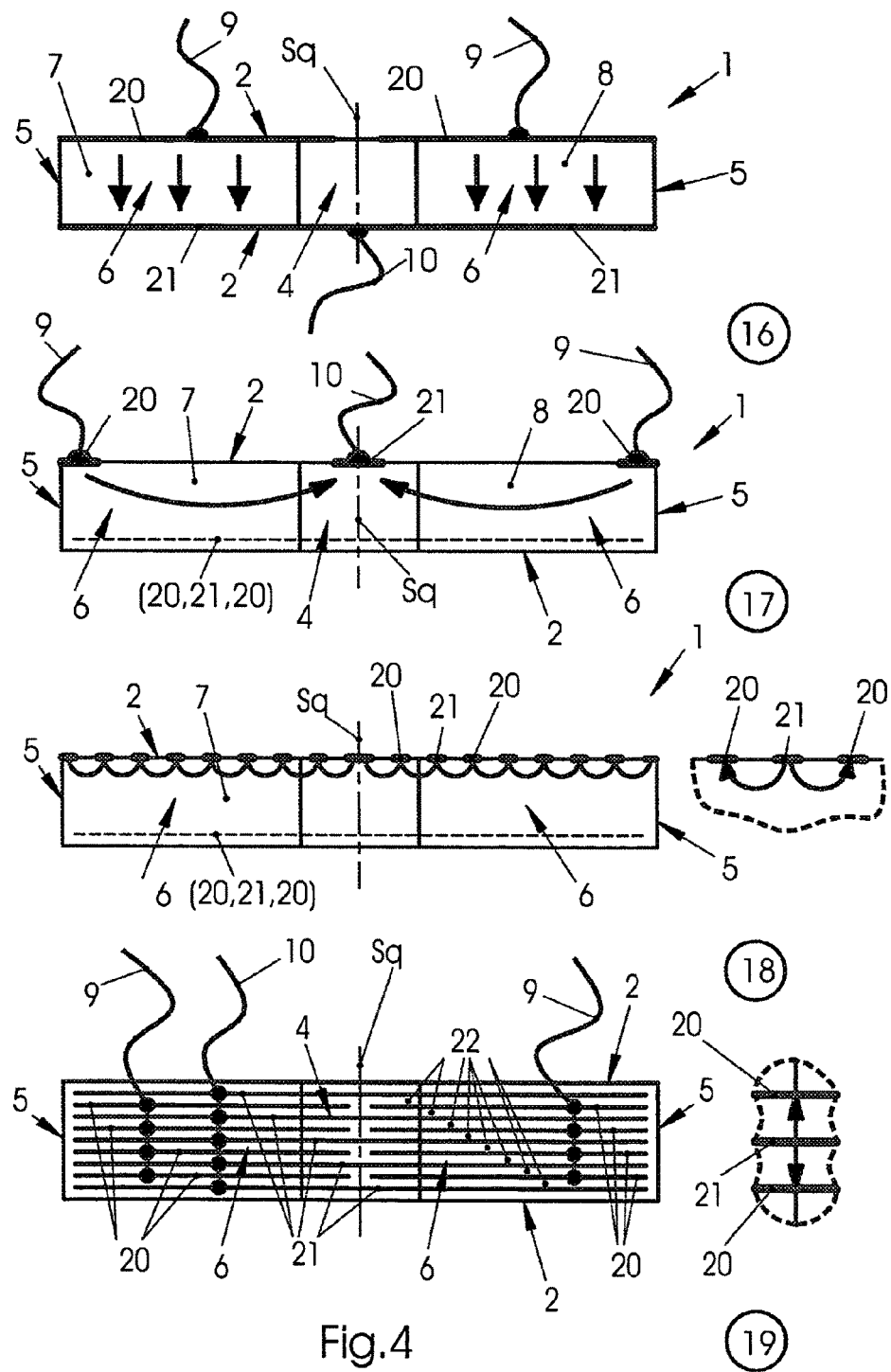
FIG. 4 shows a schematic representation of different constructive modifications of generators for an ultrasonic standing wave.

FIG. 4 shows the schematic representation of different constructive modifications of generators for an ultrasonic standing wave. In the first three modifications according to representations 16, 17 and 18 the piezoelectric plate 1 is realized as a monolithic body of piezoelectric ceramics, and each of the generators 7 and 8 comprises an excitation electrode 20, a common electrode 21 and a piezoelectric ceramics located between said electrodes.

In the embodiment shown in representation 16 the excitation electrodes 20 and the general electrodes 21 are located on the opposite main surfaces 2. In the embodiments shown in representations 17 and 18 the excitation electrodes 20 and the general electrodes 21 are located on one and the same main surface 2. That is, the electrodes may be arranged on one or on two main surfaces of the piezoelectric plate 1. In both cases preferably strip-shaped electrodes are used.

Representation 19 in FIG. 4 shows another possible embodiment of the generators 7 and 8, wherein these generators are comprised of layers of the excitation electrodes 20, of layers of the general electrodes 21 and of layers of piezoelectric ceramics 22 arranged between these layers. All layers are arranged in parallel with respect to the main surfaces 2 of the piezoelectric plate 1. During the sintering of the ceramics the layers of electrodes 20 and 21 and the layers of piezoelectric ceramics 22 between the electrodes are connected to each other such that the piezoelectric plate 1 forms a monolithic multilayer body.

Representations 16 to 19 of FIG. 4 show the direction of polarization of the piezoelectric ceramics of the piezoelectric plate 1 by means of arrows.

Figure 5:
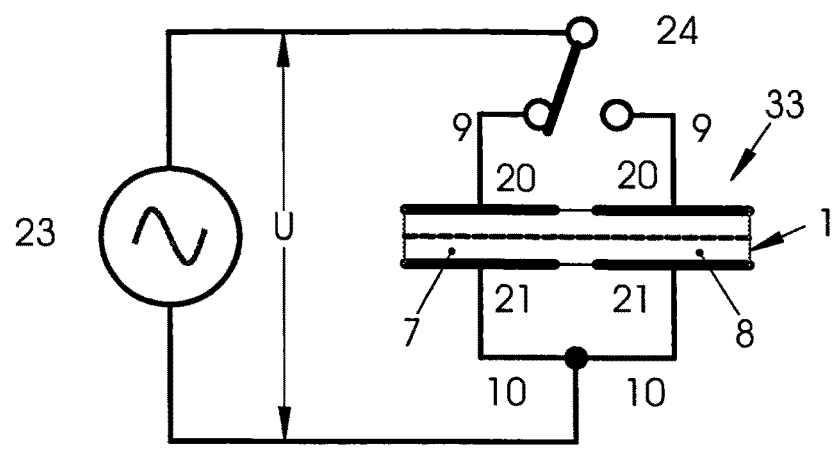
FIG. 5 shows a circuit diagram to illustrate the connection of the inventive ultrasonic actuator to an electrical excitation device.

FIG. 5 shows a circuit diagram which schematically represents the connection of the ultrasonic actuator according to the invention to an electrical excitation device 23. The electrical excitation device 23 provides an electric alternating voltage U with a frequency fo. Due to the electric voltage U the current I flows through the generators 7 and 8. The circuit comprises a changeover switch 24 for the generators 7 and 8.

Figure 6:
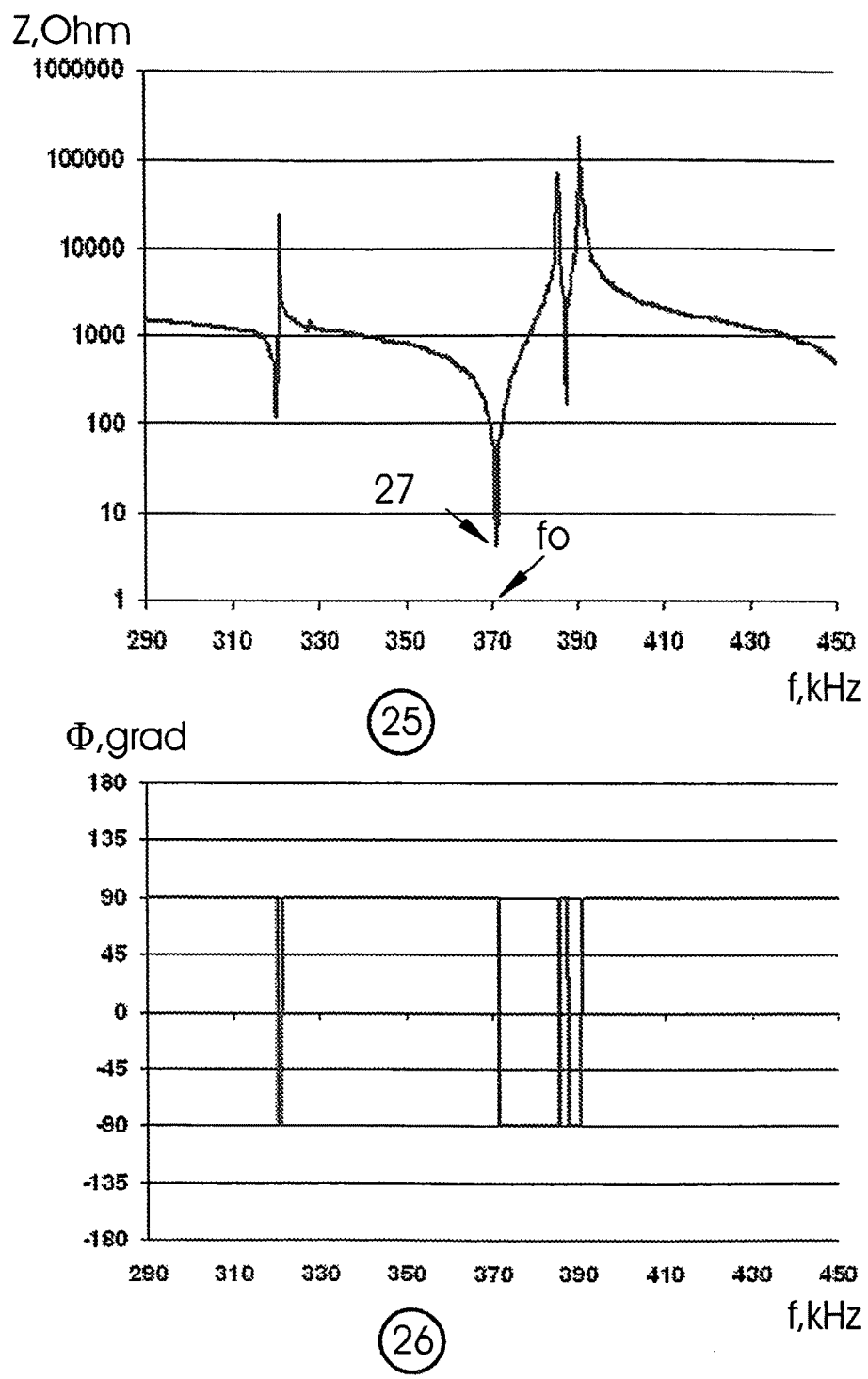
FIG. 6 shows a representation of the dependence of the electric impedance of the inventive ultrasonic actuator on the frequency of the electric excitation voltage (illustration 25) and the frequency dependence of the angle $\Phi$ between an electric excitation voltage U and a current I of a generator (illustration 26)

FIG. 6 illustrates in representation 25 the dependence of the electrical impedance of the ultrasonic actuator according to the invention on the frequency of the electric excitation voltage, while representation 26 shows the frequency dependence of angle Φ between an electric excitation voltage U and a current I of the generators 7 and 8. The respective dependences are indicated for a piezoelectric plate which is made of the piezoelectric ceramics PIC 181 of the company PI Ceramic GmbH and has the dimensions L=10 mm, H=5 mm, n=2 mm, m=1 mm and t=1 mm. The peak 27 represents the resonance at the frequency fo=371 kHz, as a result of which an asymmetrical standing wave is generated in the oscillator, which is used in the ultrasonic actuator according to the invention.

Figure 7:
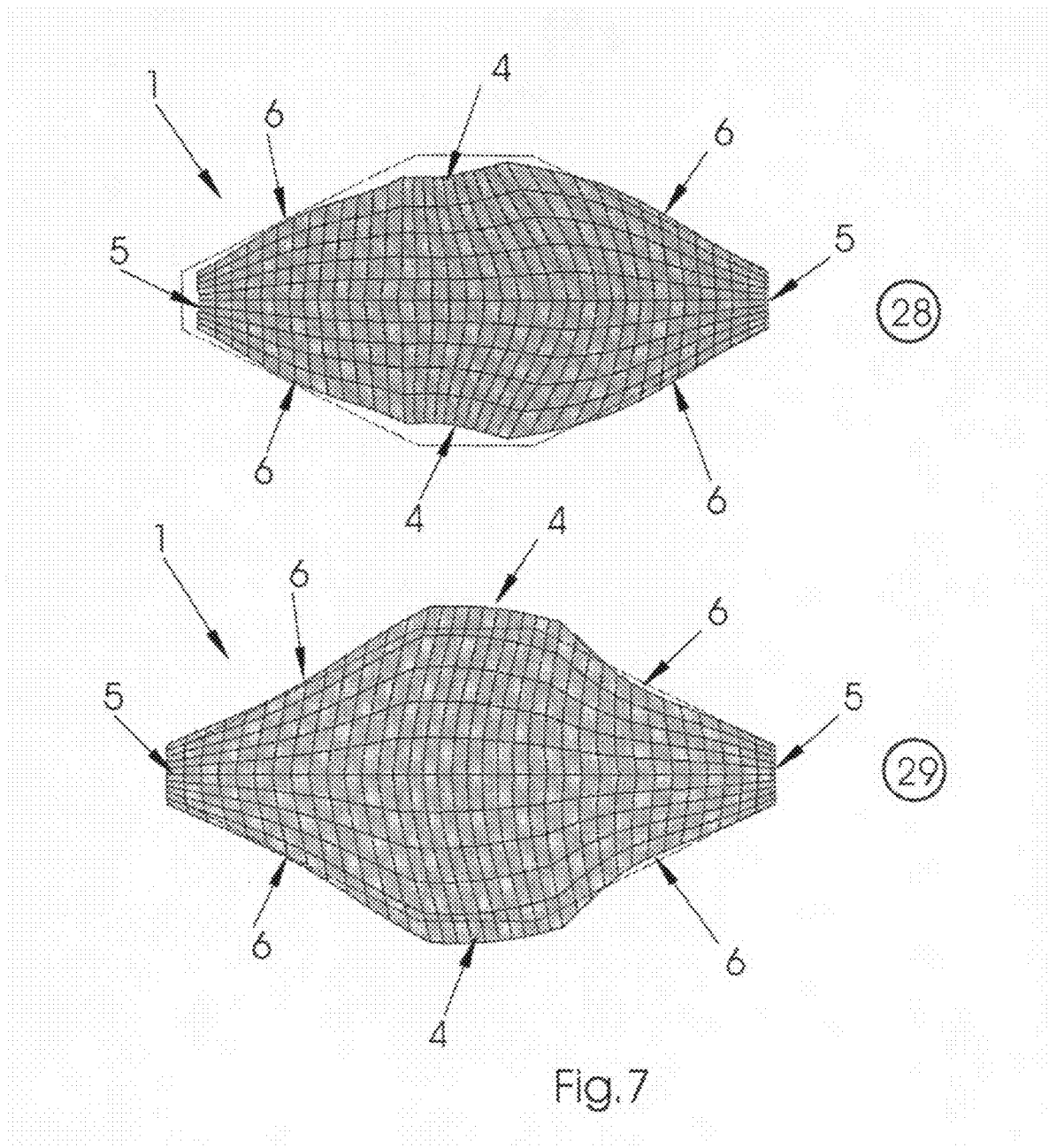
FIG. 7 shows a schematic representation of deformation states of the inventive ultrasonic actuator.

FIG. 7 illustrates in representations 28 and 29 the maximum deformations of the piezoelectric plate 1 when an asymmetrical standing wave is generated in it during the operation. The representations are shifted by half an oscillation period in terms of time.

Figure 8:
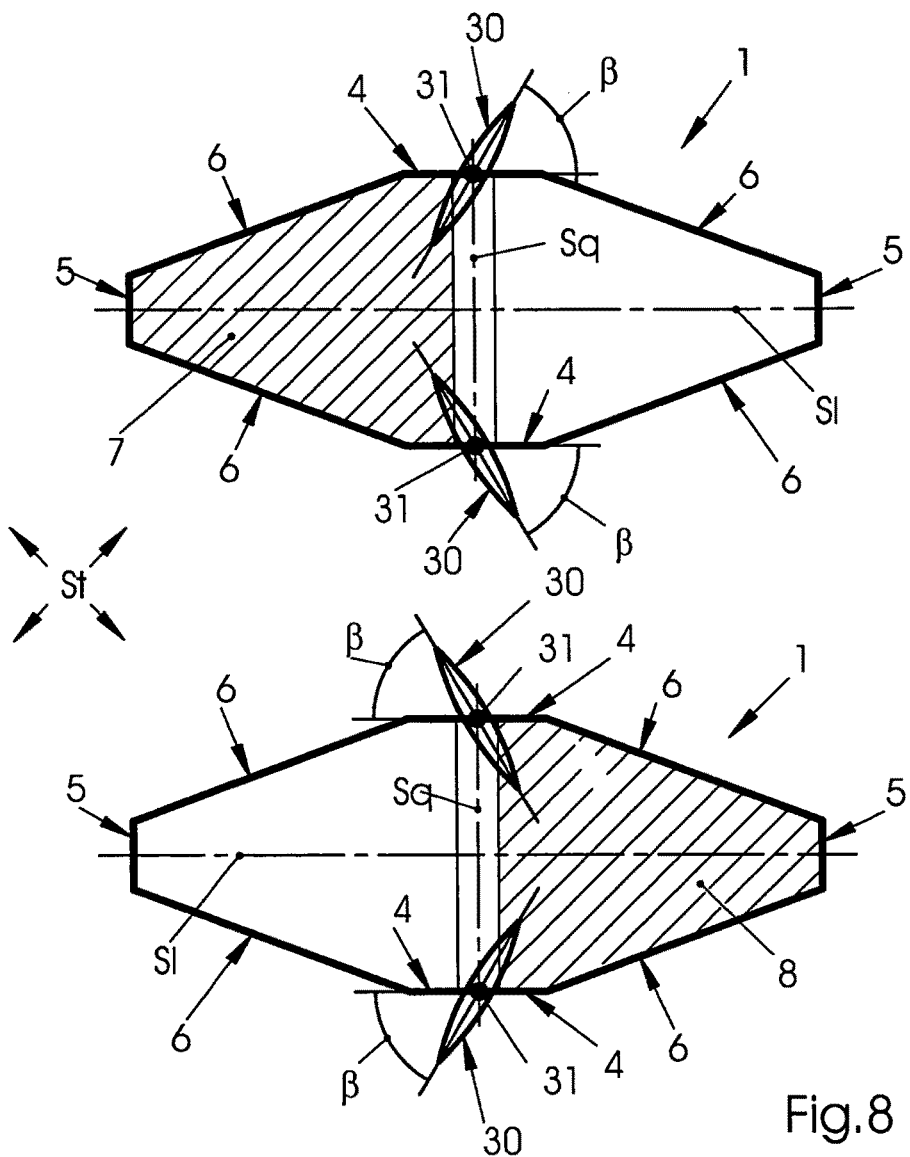
FIG. 8 shows a schematic representation of the paths of motion of material points of the inventive ultrasonic actuator.

FIG. 8 shows paths of motion 30 of points 31 located in the center of the working surfaces 4 of the piezoelectric plate 1 during a generation of an asymmetrical standing wave in it. The paths of motion 30 are inclined at the angle β relative to the surface of the main surfaces 4.

Figure 9:
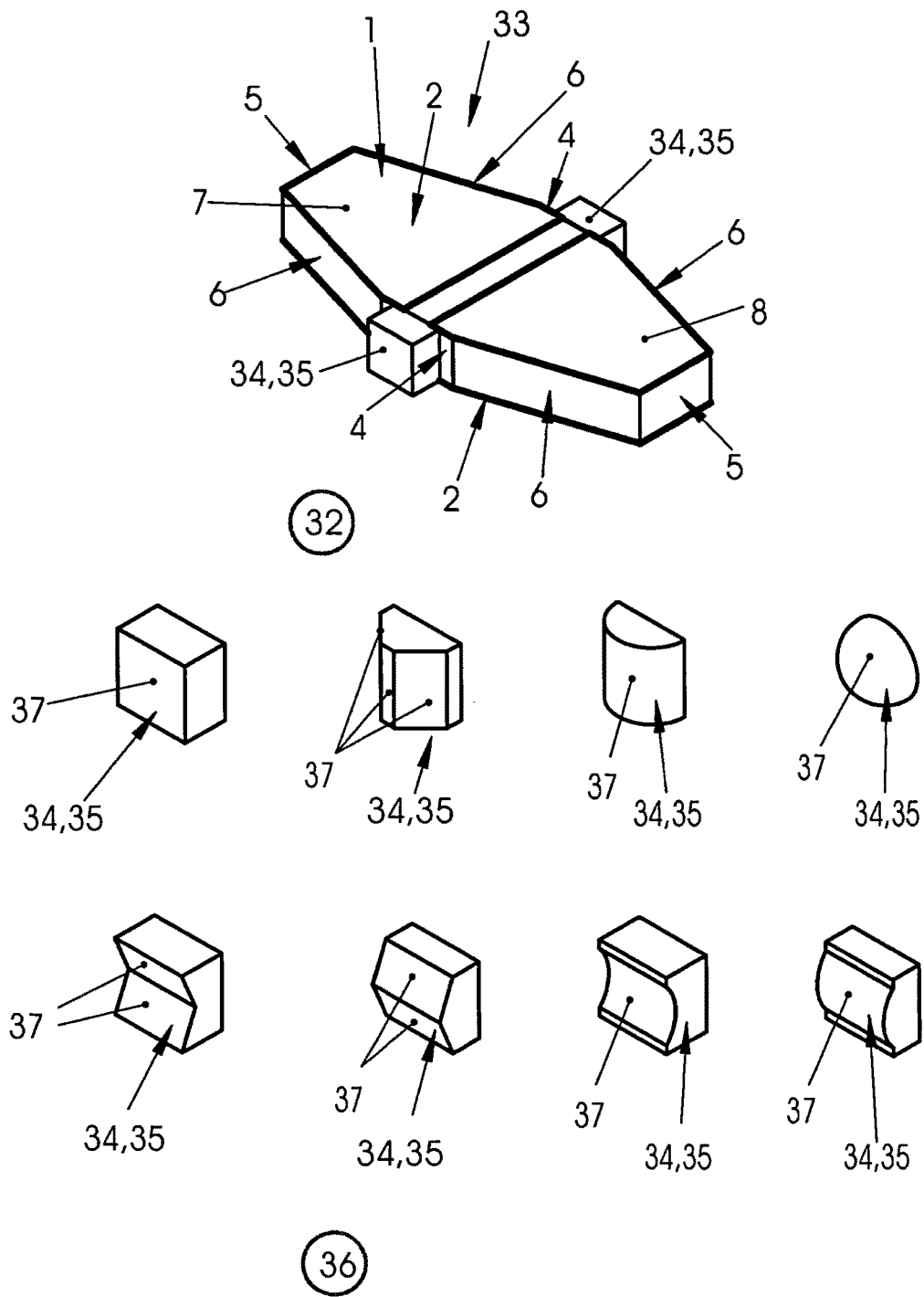
FIG. 9 shows a schematic representation of different embodiments of the friction element or the slide.

FIG. 9 shows in representation 32 an embodiment of the ultrasonic actuator 33 according to the invention whose working surfaces 4 comprise a friction element 34 or a slide 35.

Representation 36 of FIG. 9 shows some of the possible embodiments of the friction element 34 or the slide 35.

The difference between the friction element 34 and the slide 35 is that the friction element 34 is made of a hard, abrasion-resistant material, while the slide 35 is made of a soft material. Both may have the same geometric shape. The friction element 34 is made of a hard, abrasion-resistant type of an oxide ceramics, e.g. of ceramics based on aluminum oxide, zirconium oxide or a mixture of both or a mixture with other materials. Also ceramics based on aluminum nitride, aluminum carbide, silicon carbide, or metal ceramics based on tungsten carbide or titanium carbide are possible. It is likewise conceivable that the friction element 34 is made of solid monocrystals, e.g. of corundum, ruby, sapphire, quartz or beryllium. Moreover, material mixtures may be used as material for the friction element 34, which are made of particles of a hard abrasion-resistant material and binding material. High temperature resistant plastics may be used as binding material, such as polyarylamide with a semi-crystalline structure.

The slide 35 is made of a relatively soft material whose Young's modulus and temperature expansion coefficient approximately correspond to the Young's modulus and the temperature expansion coefficient of the piezoelectric ceramics. This applies, for example, to types of soft oxide ceramics. In order to reduce or prevent abrasion the friction surface of the slide 35 is covered with a thin abrasion-resistant layer 37. Abrasion-resistant glass or glass enriched with particles of an abrasion-resistant material may be used as abrasion-resistant layer 37. Also, a layer of chemically deposited nickel or chromium is possible. Also, a layer of aluminum oxide or zirconium oxide, deposited by means of plasma deposition, or a layer containing small diamond crystals deposited from the gas phase may be used. Also, the use of layers in the form of thin coatings, for example, of CrN, CrCN, (Cr, W)N, (Cr, Al)N, NbN—CrN, TiN, TiCN, (Ti,Al)N or $V_2O_5$ is conceivable.

The friction element 34 or the slide 35 can be fixed to the piezoelectric plate 1 by welding or gluing them onto the working surfaces 4. The welding is performed with the aid of low melting glasses, or by means of other materials which result in a chemical bond of the piezoelectric ceramics with the material of the friction element 34 or the slide 35. The gluing may be accomplished by an epoxy resin or by means of other similar adhesives.

Figure 10:
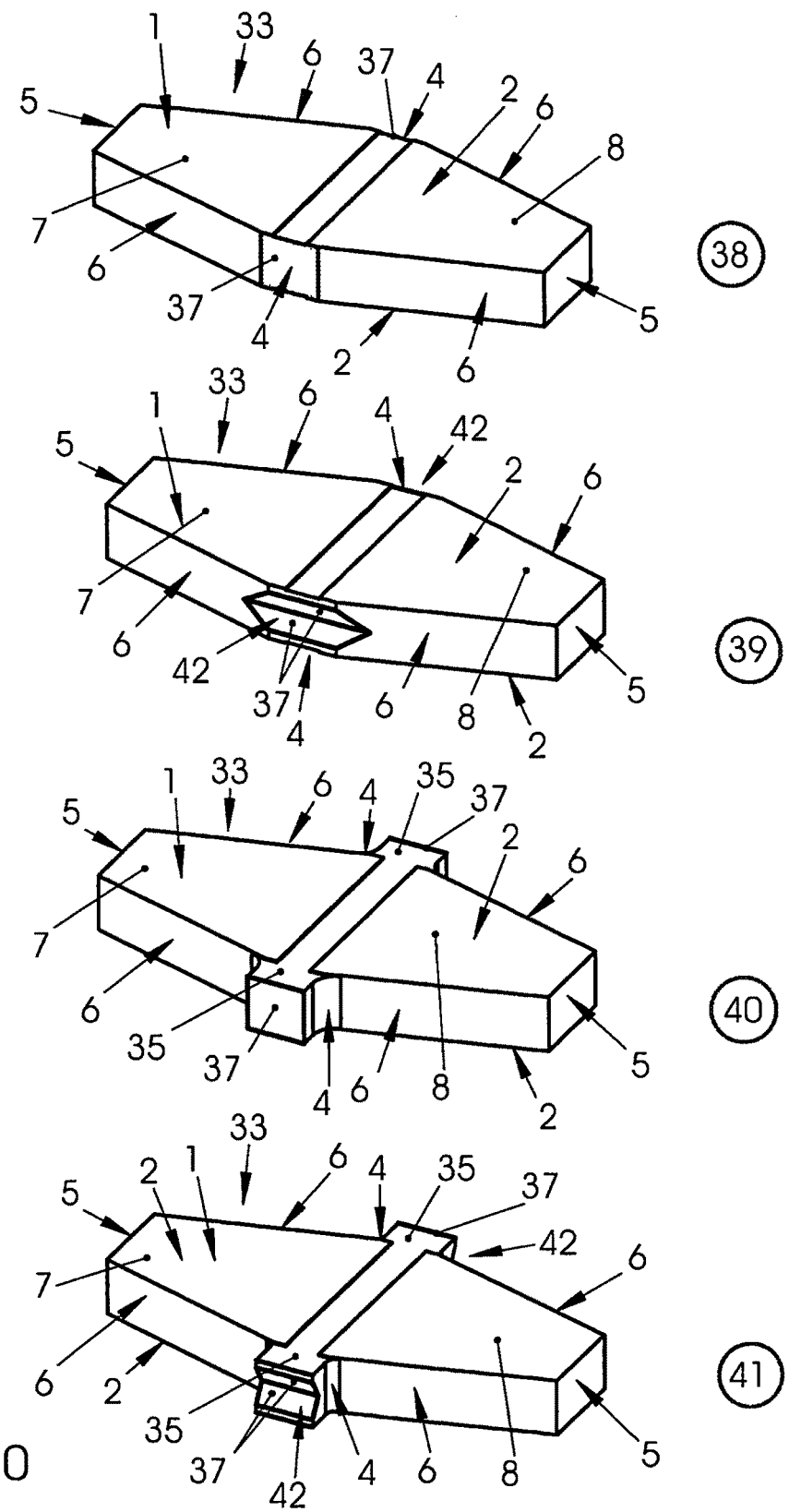
FIG. 10, 11 show a schematic representation of different other embodiments of the inventive ultrasonic actuator.

FIG. 10 shows in representations 38 to 41 further possible embodiments of the ultrasonic actuator according to the invention. The working surfaces 4 of the ultrasonic actuator 33 shown in representation 38 of FIG. 10 do not comprise friction elements 34 or slides 35. In this case the abrasion-resistant layer 37 is directly applied to the piezoceramic surface of the working surfaces 4. The working surfaces 4 of the ultrasonic actuator 33 shown in in representation 39 of FIG. 10 comprise guide grooves 42. The guide grooves 42 have in a cross-sectional view, for example, a triangular, round, square or trapezoidal shape. The surfaces of the guide grooves 42 may be provided with an abrasion-resistant layer 37. Moreover, this surface may be covered by a thin graphite or molybdenum sulfide layer, which stabilizes the function of the friction contact.

The ultrasonic actuators 33 shown in representations 40 and 41 comprise slides 35 that are made of the same piezoelectric ceramics as the piezoelectric plate 1. In order to avoid or reduce abrasion the friction surfaces are provided with the abrasion-resistant layer 37.

Figure 11:
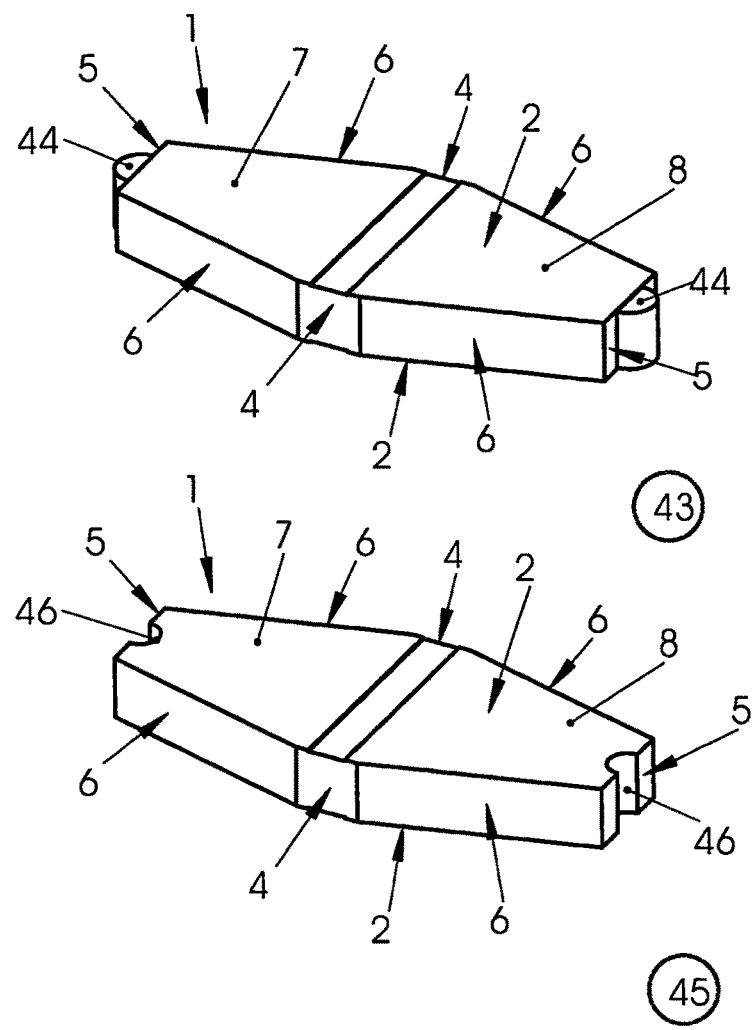

FIG. 11 shows in representation 43 an embodiment of the ultrasonic actuator according to the invention whose holding surfaces 5 comprise fixing elements 44. During the production process the fixing elements 44 may be made of the same piezoelectric ceramics as the piezoelectric plate 1. They may also be made of other materials, however, e.g. of soft types of oxide ceramics or of hard polymer materials. In this case the fixing elements 44 may be welded or soldered onto the holding surfaces 6 of the piezoelectric plate 1. The welding is accomplished by means of low melting glasses, or by means of other materials resulting in a chemical bond between the piezoelectric ceramics and the material of the fixing element 44. The gluing is accomplished with an epoxy resin or by means of other similar adhesives.

Representation 45 of FIG. 11 shows another embodiment of the ultrasonic actuator according to the invention, whose holding surfaces 5 comprise fixing grooves 46.

Figure 12:
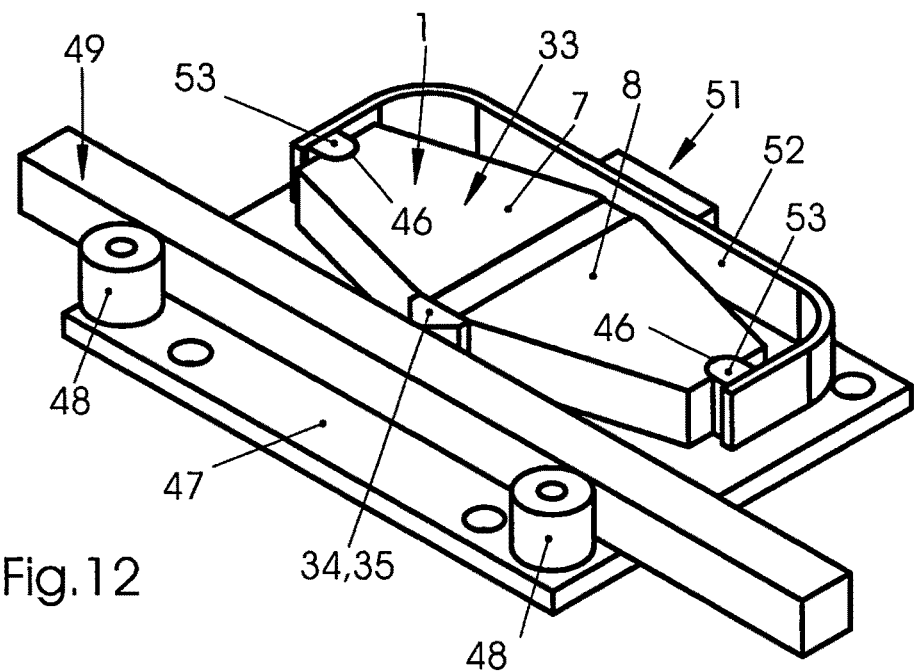

FIG. 12 shows a first application example of the ultrasonic actuator according to the invention in an ultrasonic motor. This motor has a base plate 47 with ball bearings 48 affixed on it, which hold a mobile element 49 designed as a rod. The friction element 34 of the ultrasonic actuator 33 is pressed against a friction surface 50 of the mobile element 49 by means of a pressing device 51, which comprises a spring 52 that simultaneously holds the piezoelectric plate 1 by means of a connector 53 sitting in the fixing grooves 46.

Figure 13:
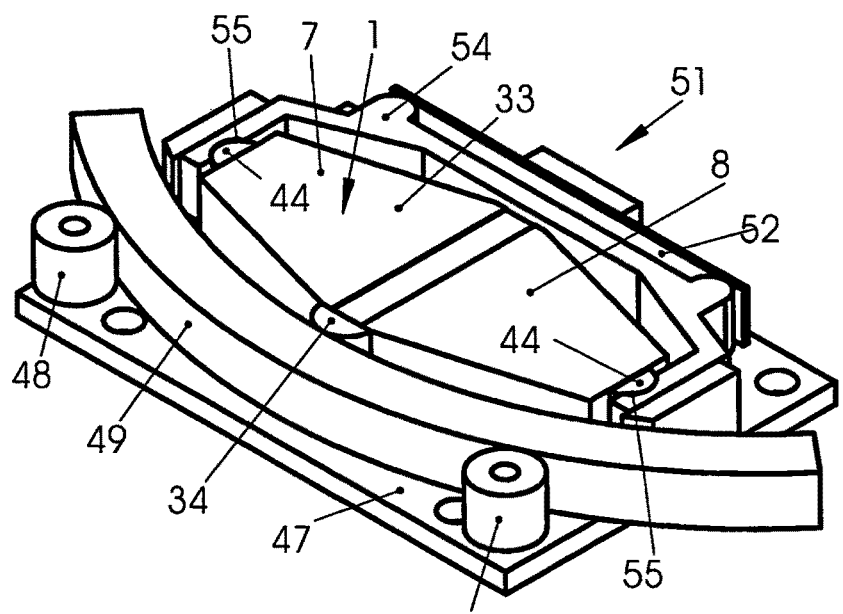

FIG. 13 shows another application example of the ultrasonic actuator according to the invention in an ultrasonic motor. The mobile element 49 is here designed as part of a ring. Also, it is conceivable, however, that the mobile element 49 is designed as a complete ring. The ultrasonic actuator 33 of this motor is held by means of a mobile bracket 54 and the pressing device 51. The mobile bracket 54 comprises grooves 55 in which the fixing elements 44 of the piezoelectric plate 1 are sitting.

Figure 14:
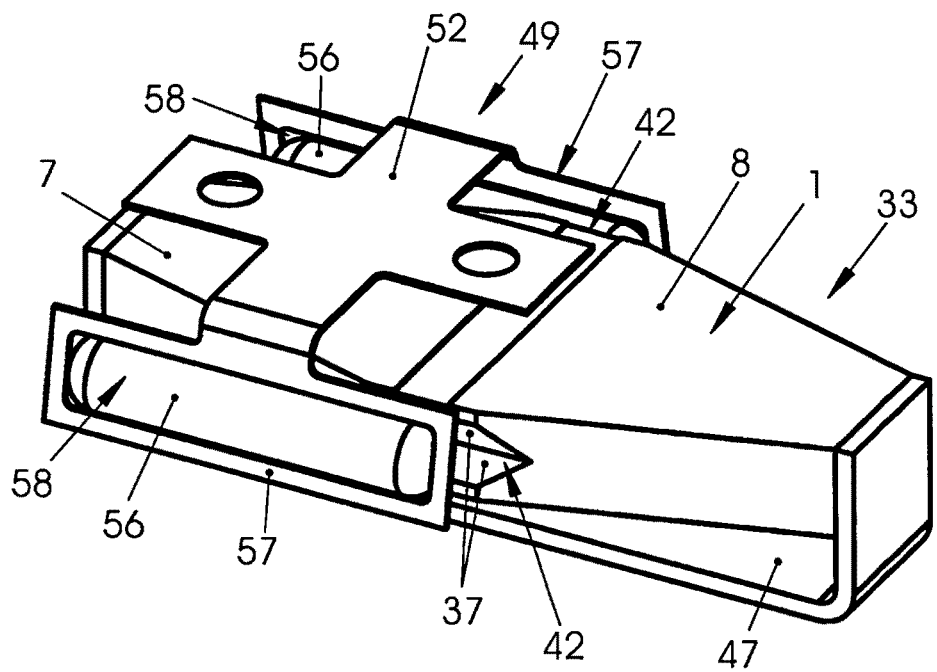
Figure 14:
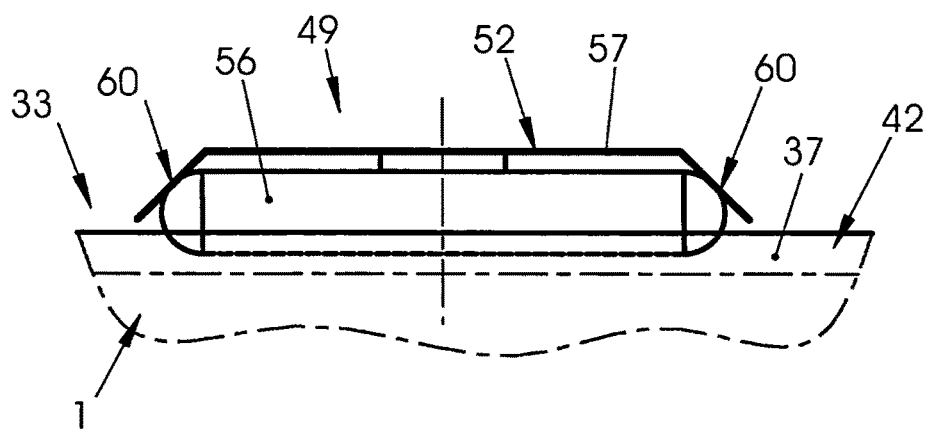

FIG. 14 shows another application example of the ultrasonic actuator according to the invention in an ultrasonic motor. The mobile element 49 has, in this case, two travelers 56 located in the guide grooves 42 of the piezoelectric plate 1. The travelers 56 are held by the spring 52 which is provided, to this end, with holders 57 having openings 58. In the modification of spring 52 as shown in representation 59 of FIG. 14 the travelers 56 are held by curved end parts 60 of the holders 57.

Figure 15:
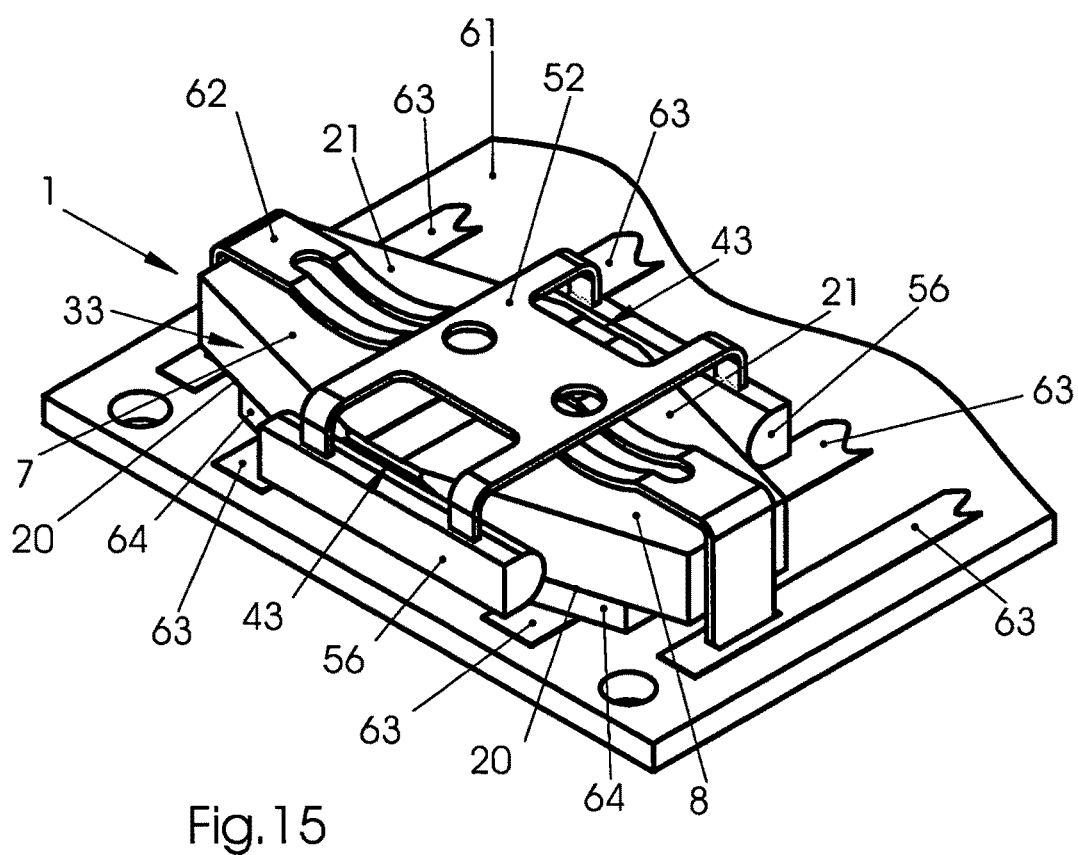

FIG. 15 shows another application example of the ultrasonic actuator according to the invention in an ultrasonic motor, in which the piezoelectric plate 1 of the ultrasonic actuator 33 is arranged on a circuit board 61. A bracket 62 serves to hold the ultrasonic actuator 33, which simultaneously assumes the function of the conductor that connects the general electrodes 21 to current-carrying paths 63 of the circuit board 61. The excitation electrodes 20 are connected to the current-carrying paths 63 by means of intermediate layers 64 made of a current-carrying rubber. The circuit board 61 simultaneously forms the plate on which the electronic components of the electric excitation device 32 of the ultrasonic actuator 33 are arranged. The mobile element 49 of this motor consists of a spring 52 which is firmly pressed together with the travelers 56, which are made of plastics, during the production. However, the travelers 56 may also be made of metal, ceramics, glass or of a filled plastic material, e.g. of polyarylamide filled with glass fibers or of epoxy resin filled with carbon fibers.

Figure 16:
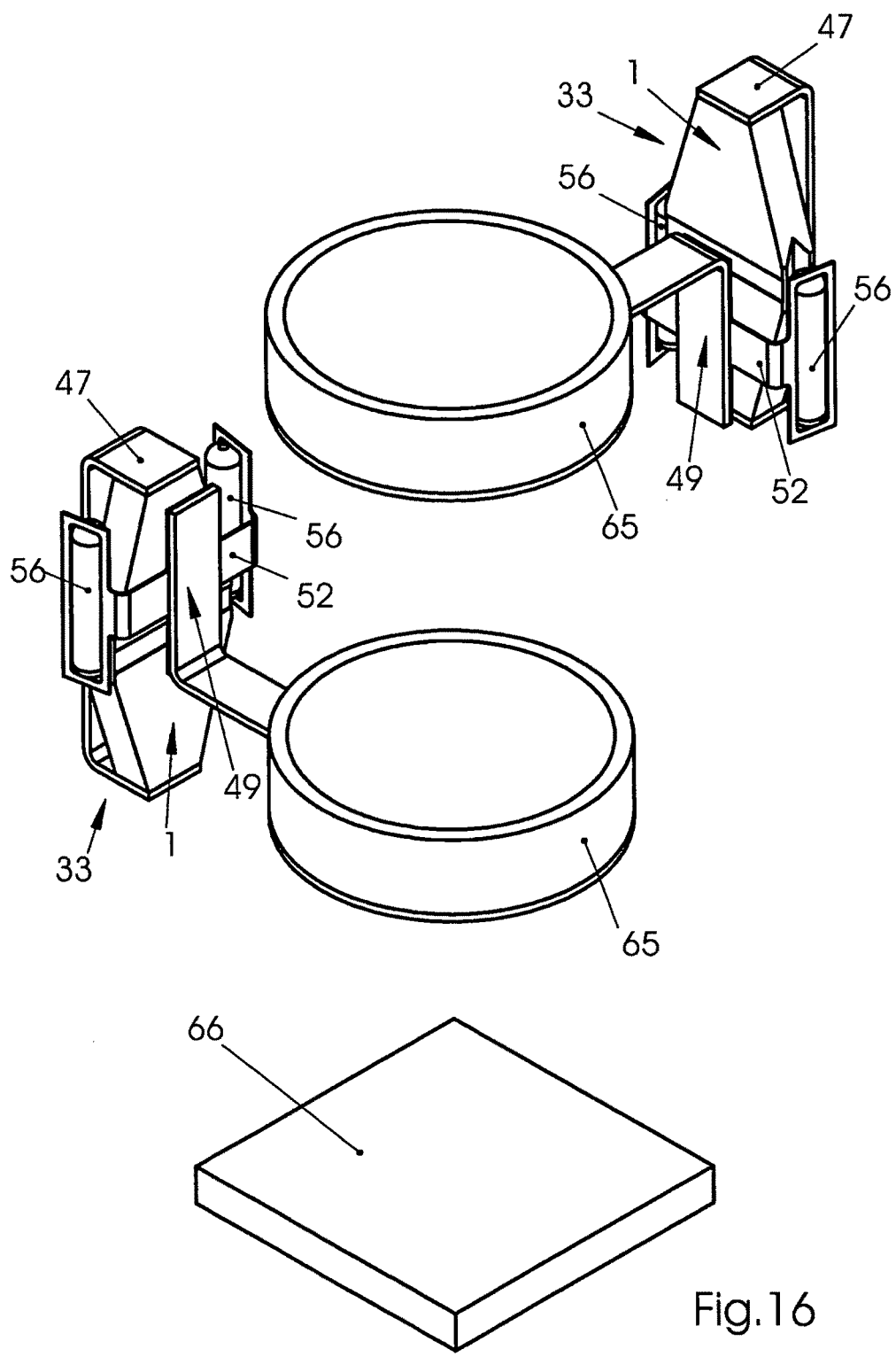

FIG. 16 shows another application example of the ultrasonic actuator according to the invention in an ultrasonic motor, wherein the ultrasonic motor is arranged in an objective of an electronic camera. In this objective one or two or three groups of optical lenses 65 may be employed. Each optical lens group 65 is arranged on the mobile element 49 of the respective ultrasonic motor. The base plate 47 of each motor is affixed in the housing of the objective (housing not illustrated in FIG. 16). The image picked up by the photographic lens of the optical lens group 65 is focused to a photosensor 66.

Figure 17:
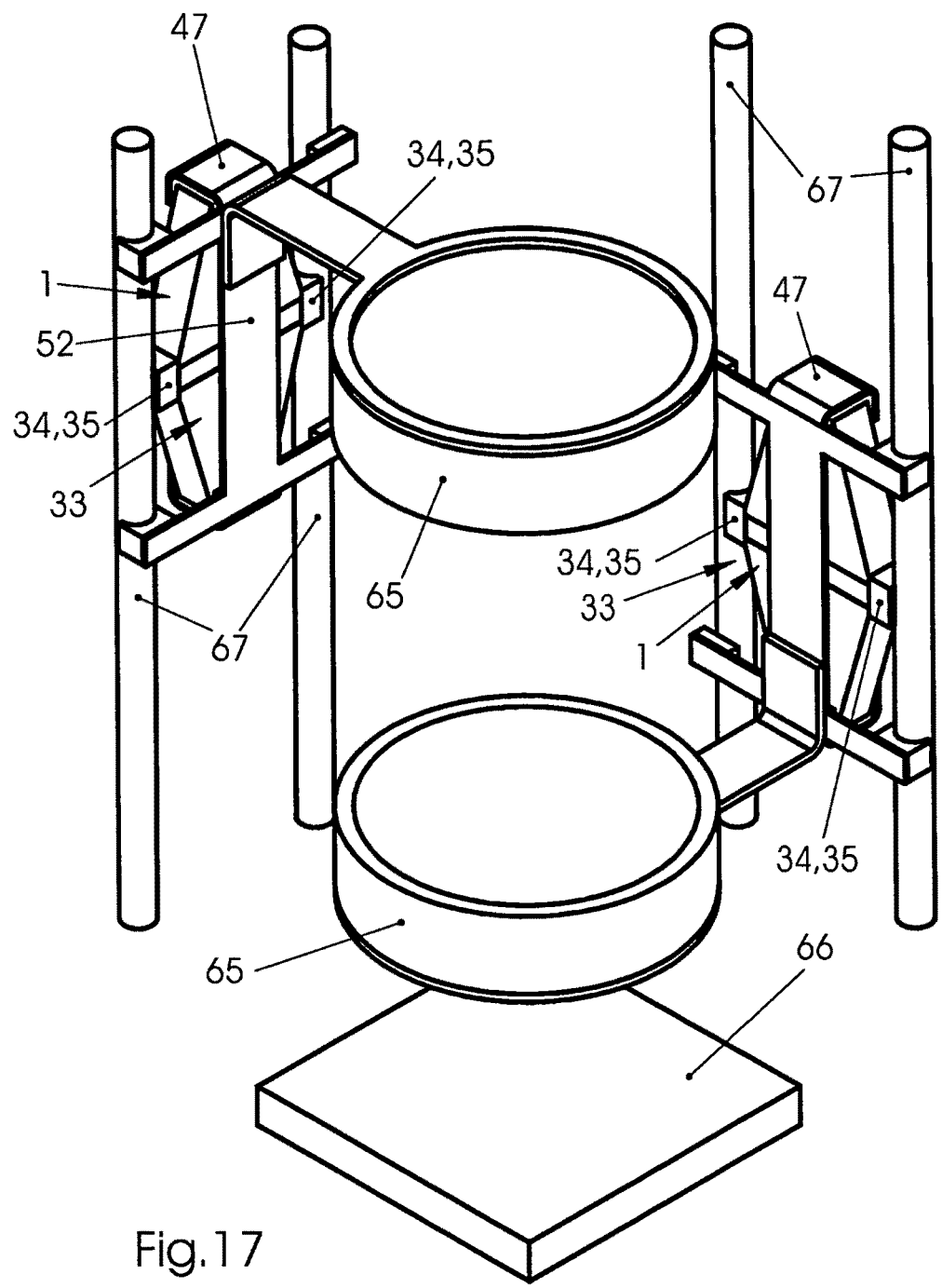

FIG. 17 shows another application example of the ultrasonic actuator according to the invention in an ultrasonic motor, wherein, in this case too, the ultrasonic motor is arranged in an objective of an electronic camera. In this objective the ultrasonic actuators 33 move on guides 67 provided in the housing of the objective.

Figure 18:
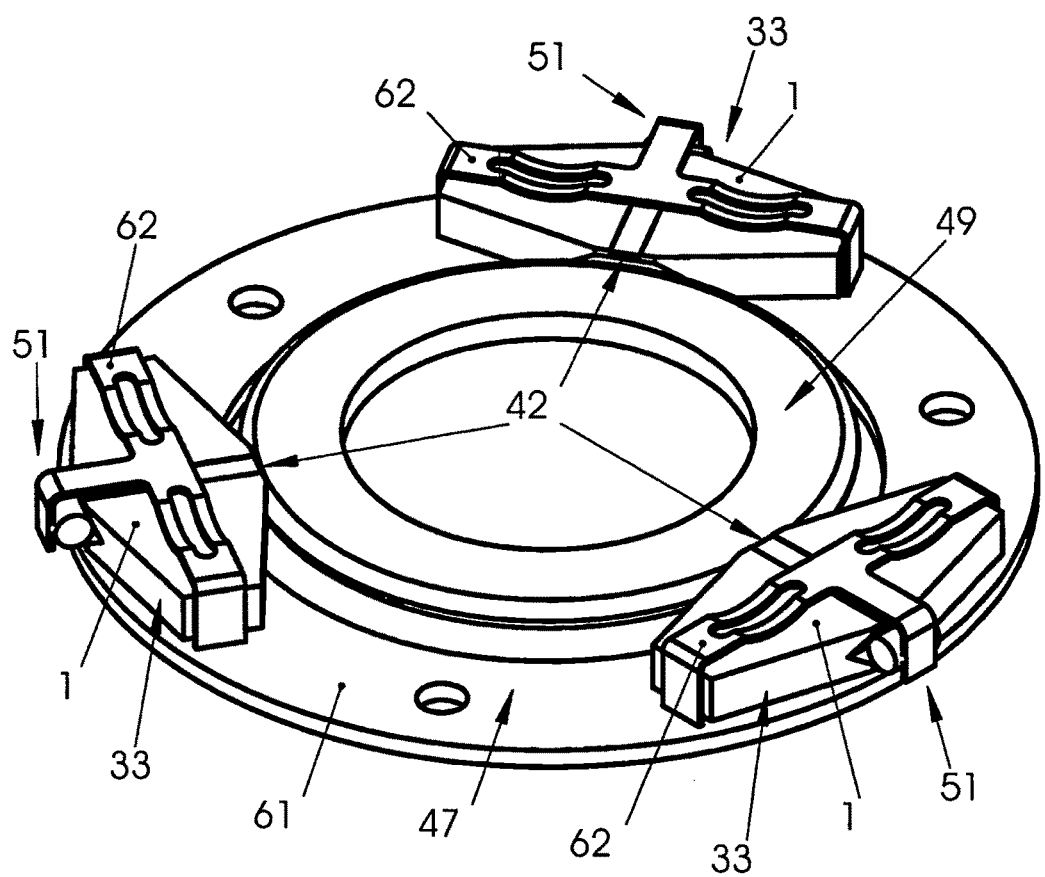

FIG. 18 shows another application example of the ultrasonic actuator according to the invention in an ultrasonic motor. The three ultrasonic motors are arranged in such a way that they can cause a rotary motion of the annular mobile element 49.

The mode of operation of the ultrasonic actuator according to the invention will be explained in more detail below.

The excitation voltage U, whose frequency is approximately equal to fo (see FIG. 6), is applied by the excitation device 23 via the changeover switch 24 (see FIG. 5) to one of the generators for an ultrasonic standing wave, e.g. generator 7 of the piezoelectric plate 1. Thus, an acoustic standing wave is generated in the piezoelectric plate 1. As the generator 7 is arranged asymmetrically relative to the plane of symmetry Sq and symmetrically relative to the plane of symmetry Sl the shape of the standing wave is asymmetrical relative to the plane of symmetry Sq and symmetrical relative to the plane of symmetry Sl. The shape of the excited wave is represented by the images of the maximum deformation shown in representations 28 and 29 of FIG. 7.

The formation of a standing wave with such a shape can be due to two reasons. In the first case the excited standing wave is the result of the superposition of the first mode of the symmetrical standing wave propagating along height H of the piezoelectric plate 1 with the second mode propagating along length L of the piezoelectric plate 1. Both modes are generated at resonance frequencies close together, so that these resonances can practically not be distinguished from each other. In the second case the generated standing wave represents a single shape of an asymmetrical standing wave which is immanent in the given shape of the piezoelectric plate 1 and is generated on its own resonance frequency.

In both modifications the points 31 located in the center of the surface of the working surfaces 4 move on the inclined paths of motion 30 illustrated in FIG. 8. Also the friction elements 34 or slides 35 (see FIGS. 9, 10, 11 and 13) arranged on the working surfaces 4 of the piezoelectric plate 1 move on the same paths of motion. Also the points of the surfaces of the guide grooves 42 move on exactly these paths of motion. In all cases the motion on the inclined paths results in a motion of the mobile elements 49, which are pressed against the ultrasonic actuator 33, in the same direction.

By connecting, instead of generator 7, generator 8 to the electrical excitation device 23 the angle of inclination of the path of motion changes from β to −β. This results in the reversal of the direction of motion of the mobile element 49.

The positive effect of the proposed invention in comparison with the ultrasonic actuator known from the prior art according to Document U.S. Pat. No. 6,765,335 (FIG. 2) is obtained for the following reason. In the ultrasonic actuator known from the prior art the piezoelectric plate of the ultrasonic motor has the rectangular shape represented by dashed lines in FIG. 2. The cross-sectional area of the piezoelectric plate of the known ultrasonic actuator relative to plane St is equal to Q. Upon the excitation of the piezoelectric plate of the known ultrasonic actuator the total piezoelectric plate oscillates, whereby the oscillation frequency is determined by length L and height H of the piezoelectric plate.

In a simplified approach it can be assumed that the mechanical losses are uniformly distributed in the cross-sectional area of the piezoelectric plate relative to plane St. Proceeding therefrom the electric power supplied to the piezoelectric plate of the known ultrasonic actuator is proportional to its cross-sectional area Q.

In the three exemplary cases shown in representations 11, 12 and 13 of FIG. 2 the piezoelectric plate 1 of the ultrasonic actuator has the shape exhibiting eight lateral faces, which is represented by a continuous line. The cross-sectional area of the piezoelectric plate 1 relative to plane St corresponds to qo in the case according to representation 11, to qm in the case according to representation 12 and to qn in the case according to representation 13. Upon exciting an asymmetrical standing wave in the piezoelectric plate 1 of the inventive ultrasonic actuator the total piezoelectric plate is oscillating as well. Like in the known ultrasonic actuator, the oscillation frequency is determined by length L and height H of the piezoelectric plate 1.

In can be assumed in case of the inventive ultrasonic actuator as well as in case of the ultrasonic actuator known from the prior art that the mechanical losses are distributed proportionally over the cross-sectional area of the piezoelectric plate 1 relative to plane St. Proceeding therefrom the electric power supplied to the piezoelectric plate 1 of the inventive ultrasonic actuator is proportional with respect to the cross-sectional area qo and qm and qn. If the piezoelectric plate of the known ultrasonic actuator and the piezoelectric plate 1 of the inventive ultrasonic actuator have the same length L and the same height H and are made of the same type of piezoelectric ceramics with the same mechanical losses and the same piezo strain coefficient, both piezoelectric plates have to be excited with the same relative power in order to obtain same oscillation amplitudes. This means that the electric power supplied to the piezoelectric plate, divided by the area of the cross-section, has to be equal in both cases.

As the piezoelectric plate 1 of the ultrasonic actuator according to the invention has a smaller cross-sectional area relative to plane St its excitation requires a smaller electric power. In order to obtain an optimum design of the piezoelectric plate 1 shown in representation 11 of FIG. 12 the power gain with L/n=H/m=5 is approximately 30% as compared with the known ultrasonic actuator.

However, in a real piezoelectric plate of the known ultrasonic actuator the mechanical losses are, in practice, not distributed uniformly. At corners of the piezoelectric plates of the known ultrasonic actuator the losses are higher, so that the real power gain in the inventive ultrasonic actuator amounts to approximately 40-50% as compared with the ultrasonic actuator known from the prior art.

This means in other words that trimming the corners of the piezoelectric rectangular plate of the known ultrasonic actuator results in the inventive ultrasonic actuator with a piezoelectric plate 1 that has at least eight lateral faces, so that the power required for operating the inventive ultrasonic actuator is reduced. The oscillation amplitude of the ultrasonic actuator is maintained, i.e. the mechanical power transferred by the ultrasonic actuator to the mobile element 49 is kept constant. By reducing the consumed power it is possible to reduce the heating of the ultrasonic actuator during operation. This increases the operational stability and its safety.

The optimum dimensions of the piezoelectric plate 1 of the ultrasonic actuator according to the invention slightly depend on the type of the piezoelectric ceramics from which the plate is manufactured. This means that the optimum dimensions of the piezoelectric plate 1 have to be determined for each type of piezoelectric ceramics in experiments.

In the embodiment of the generators 7 and 8 shown in representation 16 of FIG. 4 the asymmetrical wave is excited by utilizing the piezo strain coefficient $d_{31}$. Such a construction of the generators 7 and 8 constitutes the simplest constructive realization and can therefore be employed in inexpensive ultrasonic actuators operating at sufficiently low excitation voltages.

In the embodiments of the generators 7 and 8 shown in representations 17 and 18 of FIG. 4 the electrodes 20 and 21 and the connections 9 and 10 may be realized on one side of the piezoelectric plate 1. This likewise simplifies the construction of the ultrasonic motor.

Representation 19 in FIG. 2 shows a piezoelectric plate 1 comprising generators 7 and 8 which are realized in a multi-layer form. The piezoelectric plate 1 with generators realized in such a manner can be driven at relatively low voltages.

By correspondingly choosing the shape for the friction element 34 or the slide 35, or by using guide grooves (see FIG. 9, 10), the tensile force on the mobile element 49 can be increased, the speed of motion of the mobile element 49 can be increased or decreased, and its positioning accuracy can be enhanced.

By using the fixing elements 44 or the fixing grooves 46 (see FIG. 11) it is possible to fix the piezoelectric plate 1 permanently as shown, for example, in FIGS. 12 and 13.

The ultrasonic actuator 33 according to the invention can cause mobile elements 49 of the most different constructions and shapes to move. The mobile element can be, for example, a rod (FIG. 12) or a ring or part of a ring (FIG. 13). Furthermore, the mobile element 49 may be realized in form of a disc, a tube, a ball or in any other shape predefined by the respective construction.

Moreover, the mobile element 49 may comprise two travelers 56 and, as illustrated in FIG. 14, may be composed of multiple components. In this case, the travelers 56 may be held by the openings 58 of the holders 57 of the spring 52.

In another modification the holders 57 may include concave end parts 60 which, as shown in position 59 of representation 14, hold the travelers 56. In both modifications it is not necessary to connect the travelers 56 to the holders 57 permanently, for example, by means of an adhesive, which simplifies the assembly of the ultrasonic motor.

The ultrasonic motor according to FIG. 15 has a modular structure. In this motor a laser reflector or another mobile element of an optical unit or a miniature head of a storage unit (not illustrated in the representation) may be mounted on the mobile element 49.

In the optical objective schematically represented in FIG. 16 the optical lens groups 65 are arranged on the mobile element 49. Such a construction of the objective is possible if no large displacement of the optical lens group is necessary.

If a large displacement of the optical lens group is necessary, the construction of the objective illustrated in FIG. 17 can be used. In this construction the ultrasonic actuator 33 is moved on guides 67 without a limitation to the displacement.

A combination of the two embodiments shown in FIGS. 16 and 17 is possible as well.

In the embodiment shown in FIG. 18 the mobile element 49 in form of a disc or ring is held and caused to perform a rotary motion by the three ultrasonic actuators 33.

The technical teaching defined herein permits a reduction of the necessary power for exciting the ultrasonic actuator according to the invention by approximately 40-50% as compared with the ultrasonic actuator known from the prior art according to Document U.S. Pat. No. 6,765,335. By reducing the necessary power it is possible to reduce the heating of the actuator which, again, increases the operational stability and operational safety. The lower required power allows the use of the inventive ultrasonic actuator in miniaturized inexpensive devices with a low electric energy demand, e.g. in objectives of miniature cameras, in objectives for portable communication means such as mobile phones, in miniaturized storage units, and in other similar equipment that require small dimensions, a high positioning accuracy and a low energy demand for the drive.

Reference Numbers
1 piezoelectric plate
2 main surfaces
3 top view of piezoelectric plate 1
4 working surface
5 holding surface
6 free surface
7 generator
8 generator
9 generator connection
10 generator connection
11 modification of piezoelectric plate 1
12 modification of piezoelectric plate 1
13 modification of piezoelectric plate 1
14 modification of piezoelectric plate 1
15 modification of piezoelectric plate 1
16 constructive modification of generator 7 and 8
17 constructive modification of generator 7 and 8
18 constructive modification of generator 7 and 8
19 constructive modification of generator 7 and 8
20 excitation electrode
21 common electrode
22 piezoceramic layer
23 electrical excitation device
24 changeover switch
25 frequency dependence of impedance Z of piezoelectric plate 1
26 frequency dependence of angle Φ
27 resonance peak
28 maximum deformation of piezoelectric plate 1
29 maximum deformation of piezoelectric plate 1
30 paths of motion of points 31
31 points in the center of the working surfaces 4
32 modification of the ultrasonic actuator 33
33 ultrasonic actuator
34 friction element
35 slide
36 modifications of the friction element 34 or slide 35
37 abrasion-resistant layer
38 modification of the ultrasonic actuator 33
39 modification of the ultrasonic actuator 33
40 modification of the ultrasonic actuator 33
41 modification of the ultrasonic actuator 33
42 guide groove
43 modification of the piezoelectric plate 1 of the ultrasonic actuator 33
44 fixing element
45 modification of the piezoelectric plate 1 of the ultrasonic actuator 33
46 fixing groove
47 base plate
48 ball bearing
49 mobile element
50 friction surface
51 pressing device
52 spring
53 connector 54 mobile bracket
55 grooves in mobile bracket 54
56 traveler
57 holder
58 opening in holder 57
59 position with constructive embodiments of the holder 57
60 end part of holder 57
61 circuit board
62 bracket
63 current-carrying path of board 61
64 intermediate layer of current-carrying rubber
65 optical lens group
66 photosensor
67 guide

The invention claimed is:

1. Ultrasonic actuator, preferably for use in an ultrasonic motor, in the form of a piezoelectric plate (1) with a length L, a height H and a thickness t, wherein the piezoelectric plate (1) has a lateral plane of symmetry Sq, a longitudinal plane of symmetry Sl and at least two main surfaces (2), and the piezoelectric plate (1) comprises at least two generators (7, 8) arranged symmetrically with respect to the plane of symmetry Sq for generating ultrasonic standing waves,
characterized in that
the piezoelectric plate (1) has a shape that includes at least eight lateral faces, wherein at least two of the lateral faces are working surfaces (4) provided to contact elements to be driven, and at least two of the lateral faces are holding surfaces (5) provided to hold the piezoelectric plate (1), and the remaining lateral faces are free surfaces (6), wherein at least four free surfaces (6) are arranged at a same angle α with respect to the longitudinal plane of symmetry Sl and/or at a same angle φ with respect to the lateral plane of symmetry Sq.

2. Ultrasonic actuator according to claim 1,
characterized in that
the working surfaces (4) have a width n and the holding surfaces (5) have a width m, and that the ratio L to n and/or the ratio H to m is in the range between 1.1 and 9, and is preferably approximately equal to 5.

3. Ultrasonic actuator according to claim 1,
characterized in that
the ratio L to H is in the range between 1.5 and 3, and is preferably approximately equal to 2.

4. Ultrasonic actuator according to claim 1,
characterized in that
the ratio L to t is in the range between 5 and 15, and is preferably approximately equal to 10.

5. Ultrasonic actuator according to claim 1,
characterized in that
the free surfaces (6) have section-wise a concave and/or convex shape.

6. Ultrasonic actuator according to claim 1,
characterized in that
each of the generators (7, 8) comprises an excitation electrode (20) and a general electrode (21), which are arranged on the main surfaces (2) of the piezoelectric plate (1), and that a piezoelectric ceramics is arranged between the excitation electrode (20) and the general electrode (21).

7. Ultrasonic actuator according to claim 1,
characterized in that
each of the generators (7, 8) comprises several layers of excitation electrodes (20), general electrodes (21) and layers of piezoelectric ceramics (22) each arranged there between, wherein said layers (22) are arranged in parallel to the main surfaces (2) of the piezoelectric plate (1).

8. Ultrasonic actuator according to claim 1,
characterized in that
at least one of the working surfaces (4) comprises at least one friction element (34) or at least one slide (35).

9. Ultrasonic actuator according to claim 1,
characterized in that
at least one of the working surfaces (4) comprises at least section-wise a guide groove (42).

10. Ultrasonic actuator according to claim 1,
characterized in that
the friction element (34) and/or the slide (35) and/or the guide groove (42) has/have at least section-wise an abrasion-resistant layer (37) on the surface.

11. Ultrasonic actuator according to claim 1,
characterized in that
at least one of the holding surfaces comprises at least one fixing element (44) or at least section-wise a fixing groove (46).

12. Ultrasonic actuator according to claim 2,
characterized in that
the ratio L to H is in the range between 1.5 and 3, and is preferably approximately equal to 2.

13. Ultrasonic actuator according to claim 2,
characterized in that
the ratio L to t is in the range between 5 and 15, and is preferably approximately equal to 10.

14. Ultrasonic actuator according to claim 3,
characterized in that
the ratio L to t is in the range between 5 and 15and is preferably approximately equal to 10.

15. Ultrasonic actuator according to claim 2,
characterized in that
the free surfaces (6) have section-wise a concave and/or convex shape.

16. Ultrasonic actuator according to claim 3,
characterized in that
the free surfaces (6) have section-wise a concave and/or convex shape.

17. Ultrasonic actuator according to claim 4,
characterized in that
the free surfaces (6) have section-wise a concave and/or convex shape.

18. Ultrasonic actuator according to claim 2,
characterized in that
each of the generators (7, 8) comprises an excitation electrode (20) and a general electrode (21), which are arranged on the main surfaces (2) of the piezoelectric plate (1), and that a piezoelectric ceramics is arranged between the excitation electrode (20) and the general electrode (21).

19. Ultrasonic actuator according to claim 3,
characterized in that
each of the generators (7, 8) comprises an excitation electrode (20) and a general electrode (21), which are arranged on the main surfaces (2) of the piezoelectric plate (1), and that a piezoelectric ceramics is arranged between the excitation electrode (20) and the general electrode (21).

20. Ultrasonic actuator according to claim 4,
characterized in that
each of the generators (7, 8) comprises an excitation electrode (20) and a general electrode (21), which are arranged on the main surfaces (2) of the piezoelectric plate (1), and that a piezoelectric ceramics is arranged between the excitation electrode (20) and the general electrode (21).

* * * * *